(12) United States Patent
Tsai et al.

(10) Patent No.: US 11,594,658 B2
(45) Date of Patent: Feb. 28, 2023

(54) FLIP-CHIP LIGHT EMITTING DIODE WITH TWO FLAT PADS

(71) Applicant: Lextar Electronics Corporation, Hsinchu (TW)

(72) Inventors: Pei-Shiu Tsai, Hsinchu (TW); Yi-Ju Chen, Hsinchu (TW); Nai-Wei Hsu, Hsinchu (TW); Wei-Chang Yu, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 26 days.

(21) Appl. No.: 17/033,700

(22) Filed: Sep. 26, 2020

(65) Prior Publication Data

US 2021/0280742 A1 Sep. 9, 2021

(30) Foreign Application Priority Data

Mar. 6, 2020 (CN) .......................... 202010151268.0

(51) Int. Cl.
*H01L 33/10* (2010.01)
*H01L 33/62* (2010.01)

(52) U.S. Cl.
CPC .............. *H01L 33/10* (2013.01); *H01L 33/62* (2013.01)

(58) Field of Classification Search
CPC ...................................................... H01L 33/62
See application file for complete search history.

(56) References Cited

U.S. PATENT DOCUMENTS

| 7,754,507 | B2 | 7/2010 | Epler et al. |
| 9,577,172 | B2 | 2/2017 | Lopez |
| 10,276,769 | B2 | 4/2019 | Chae et al. |
| 10,283,670 | B2 | 5/2019 | Hashimoto et al. |
| 10,580,933 | B2 | 3/2020 | Oh et al. |
| 2018/0198022 | A1* | 7/2018 | Sung ................... H01L 25/0753 |
| 2018/0212125 | A1* | 7/2018 | Chen ...................... H01L 33/46 |
| 2018/0323236 | A1 | 11/2018 | Oh et al. |
| 2019/0148600 | A1 | 5/2019 | Chen et al. |
| 2020/0194627 | A1 | 6/2020 | Ozeki et al. |

FOREIGN PATENT DOCUMENTS

| JP | 2017-92477 A | 5/2017 |
| JP | 2017-120874 A | 7/2017 |
| JP | 2018-121058 A | 8/2018 |
| JP | 6635206 B1 | 1/2020 |
| KR | 10-2018-0024555 A | 3/2018 |

* cited by examiner

*Primary Examiner* — Stephen M Bradley

(74) *Attorney, Agent, or Firm* — CKC & Partners Co., LLC

(57) ABSTRACT

A light-emitting element is provided, including a semiconductor structure, a reflective structure, first insulating structures, a conductive structure, and first and second pads. The reflective structure is disposed on the semiconductor structure. The first insulating structure includes first and second insulating portions covering first and second portions respectively, and a gap exposes a third portion between the first and second portions. The conductive structure includes first and second conductive portion. The first conductive portion is disposed on the first insulating portion to contact the semiconductor structure. The second conductive portion is disposed on the second insulating portion to contact the third portion through the gap. The first and second pads are respectively disposed on the first and second conductive portions. Each of the structures below the first and second pads are in flat-type bonding to enhance stress resistance.

9 Claims, 7 Drawing Sheets

FLIP-CHIP LIGHT EMITTING DIODE WITH TWO FLAT PADS

CROSS-REFERENCE TO RELATED APPLICATION

This application claims priority to China Application Serial Number 202010151268.0, filed on Mar. 6, 2020, which is herein incorporated by reference in its entirety.

BACKGROUND

Field of Invention

The present invention relates to a light-emitting element. More particularly, the present invention relates to a flip-chip light-emitting element.

Description of Related Art

Light-Emitting Diode (LED) is a light-emitting element made of semiconductor material, which can convert the electrical energy to light. Light-emitting diode has the advantages of small volume, high efficiency of energy conversion, long working lifetime, low power consumption, etc. Therefore, light-emitting diodes are widely used in every electronic device as a light source.

Although the current flip-chip light-emitting diodes have improved the luminous efficiency of traditional light-emitting diodes, the uneven current diffusion results in low luminous brightness, and the uneven eutectic surface results in low stress resistance.

SUMMARY

The present disclosure provides a light-emitting element, comprising a semiconductor structure, a reflective structure, a first insulating structure, a conductive structure, a first pad, and a second pad. The reflective structure is disposed on a portion of the semiconductor structure. The first insulating structure comprises a first insulating portion, a second insulating portion, a gap, and a recession. The first insulating portion covers a first portion of the reflective structure. The second insulating portion covers a second portion of the reflective structure. The gap exposes a third portion between the first portion and the second portion of the reflective structure, and the third portion separates the first insulating portion and the second insulating portion. The recession exposes a first peripheral upper surface of the semiconductor structure. The conductive structure comprises a first conductive portion, a second conductive portion, and a trench. The first conductive portion is disposed on the first insulating portion, and contacts the first peripheral upper surface of the semiconductor structure through the recession. The second conductive portion is disposed on the second insulating portion, and contacts the third portion of the reflective structure through the gap. The trench separates the first conductive portion and the second conductive portion. The first pad is disposed on the first conductive portion. The second pad is disposed on the second conductive portion. Each of the structures directly below the first pad and the second pad are in flat-type bonding, and does not have any protrusion or recession design.

In some embodiments, the conductive structure further comprises a plurality of concaves located at a peripheral of the conductive structure, and shrinking horizontally toward a center of the conductive structure.

In some embodiments, the first insulating structure further comprises a third insulating portion covering a second peripheral upper surface of the conductive structure, wherein the second peripheral upper surface located at an outer side of the first peripheral upper surface.

In some embodiments, the light-emitting element further comprises a second insulating structure. The second insulating structure covers the conductive structure and the third insulating portion, and contacts the first insulating portions of the first insulating structure through the trench, in which the second insulating structure comprises a shape to correspondingly expose the first pad and the second pad.

In some embodiments, the second insulating structure is not directly connected to the first pad and the second pad.

In some embodiments, the semiconductor structure from bottom to top sequentially comprises a first semiconductor layer, an active layer, and a second semiconductor layer.

In some embodiments, the light-emitting element further comprises at least one via penetrating through the active layer, the second semiconductor layer, the first portion of the reflective structure, and the first insulating portion of the first insulating structure exposing the first semiconductor layer, the first conductive portion is contacted the first semiconductor layer through the at least one via.

In some embodiments, the light-emitting element further comprises a substrate, the semiconductor structure is disposed on the substrate.

In some embodiments, the first insulating structure further comprises a Bragg reflector formed on an upper surface of the reflective structure and a side wall of the semiconductor structure, in which the Bragg reflector comprises a plurality of pairs of sub-layers, and each of the sub-layers has a refractive index different from that of the adjacent sub-layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The invention can be more fully understood by reading the following detailed description of the embodiment, with reference made to the accompanying drawings as follows.

DETAILED DESCRIPTION

The following disclosure provides detailed description of many different embodiments, or examples, for implementing different features of the provided subject matter. These are, of course, merely examples and are not intended to limit the invention but to illustrate it. In addition, various embodiments disclosed below may combine or substitute one embodiment with another, and may have additional embodiments in addition to those described below in a beneficial way without further description or explanation. In the following description, many specific details are set forth to provide a more thorough understanding of the present disclosure. It will be apparent, however, to those skilled in the art, that the present disclosure may be practiced without these specific details.

Further, spatially relative terms, such as "beneath," "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

A number of examples are provided herein to elaborate the light-emitting element of the instant disclosure. However, the examples are for demonstration purpose alone, and the instant disclosure is not limited thereto.

Figure 1:
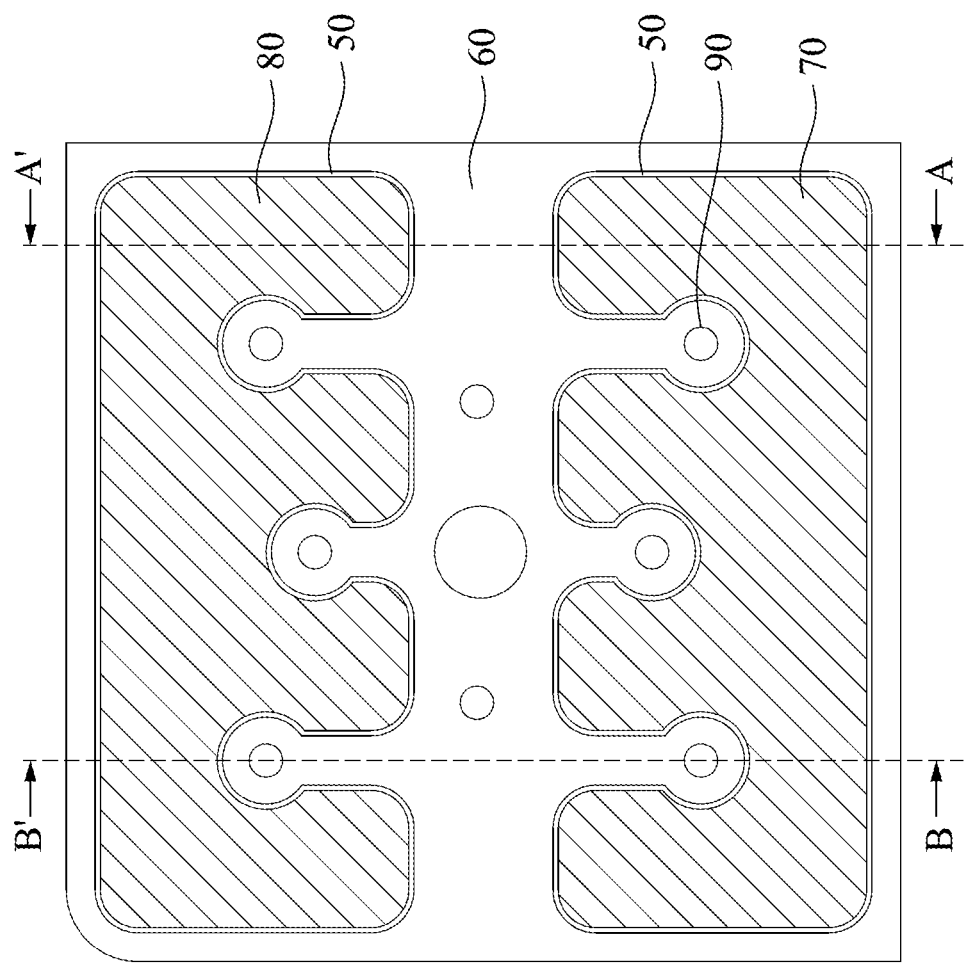
FIG. 1 is a perspective view of a light-emitting element according to one embodiment of the present disclosure.
Figure 2:
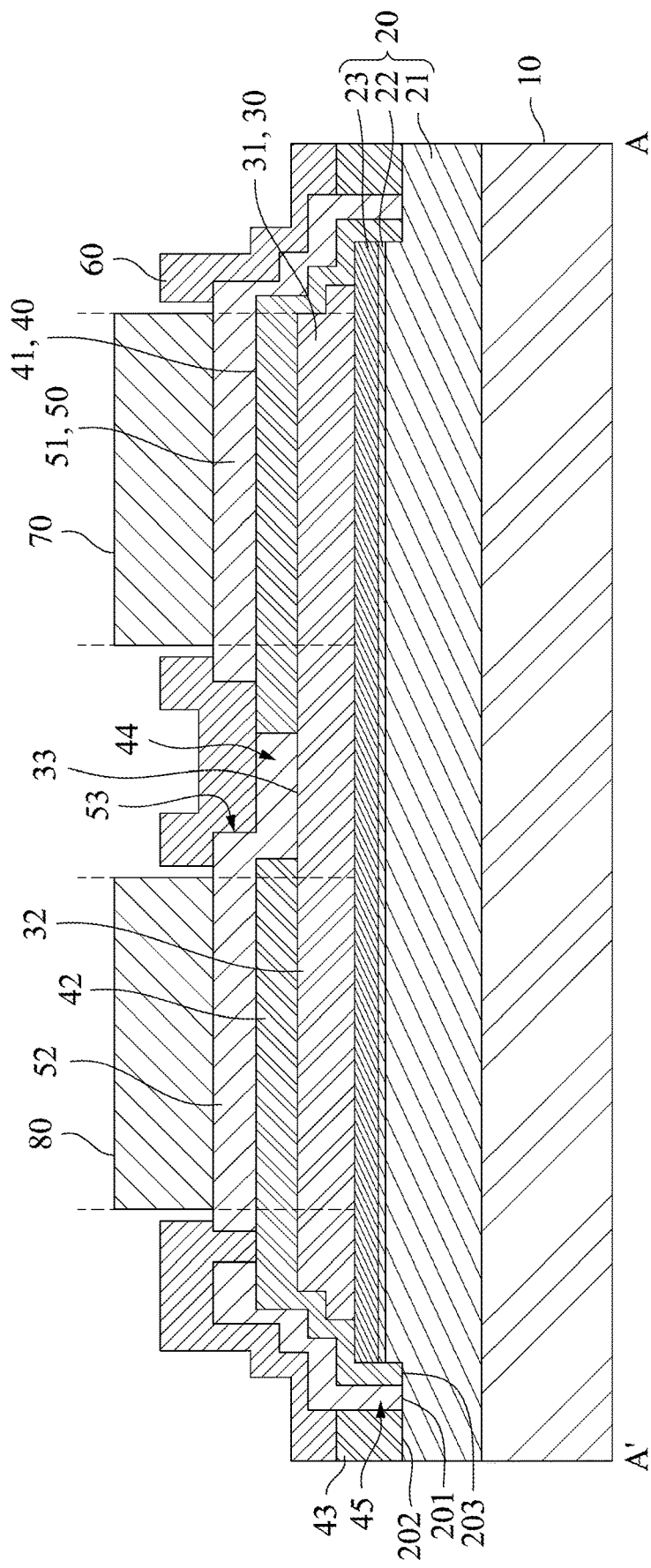
FIG. 2 is a cross-sectional view of the light-emitting element along line AA' in FIG. 1.
Figure 3:
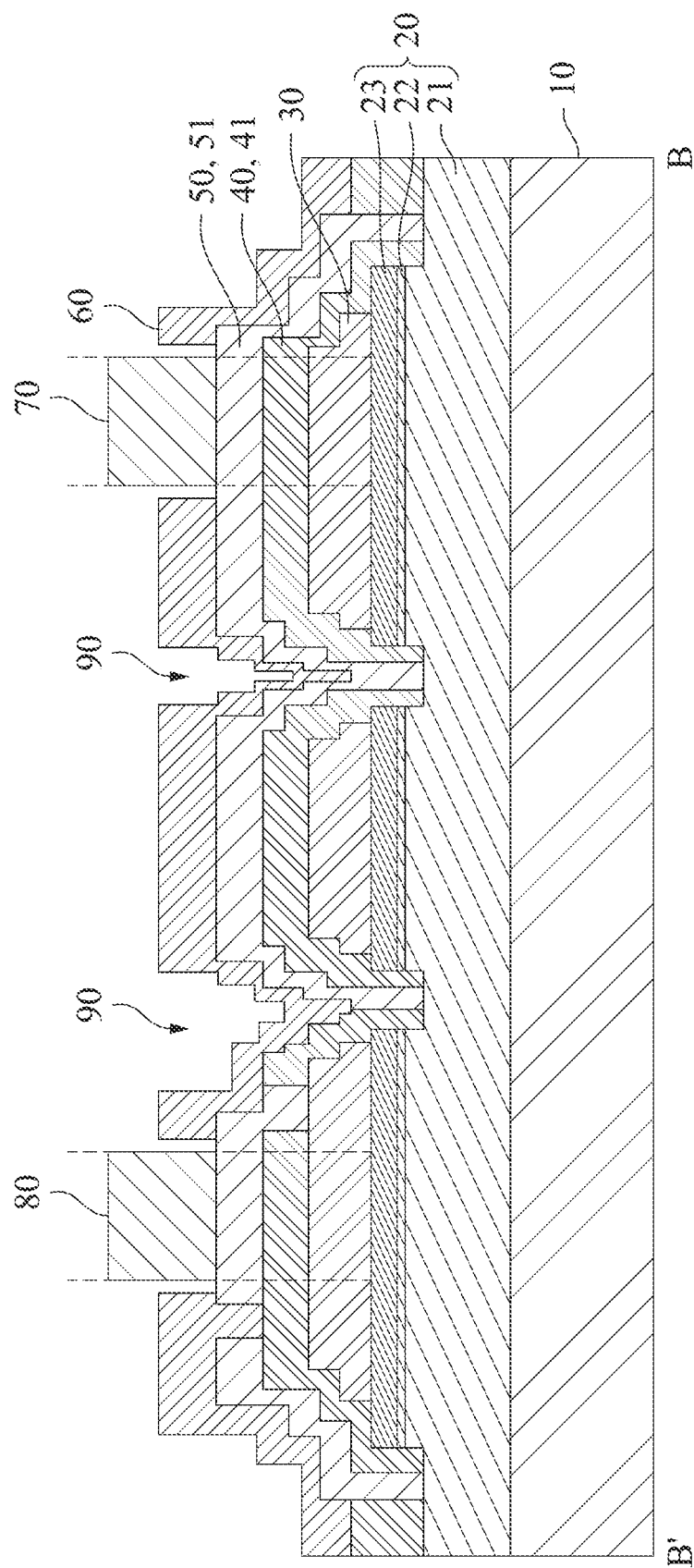
FIG. 3 is a cross-sectional view of the light-emitting element along line BB' in FIG. 1.
Figure 6:
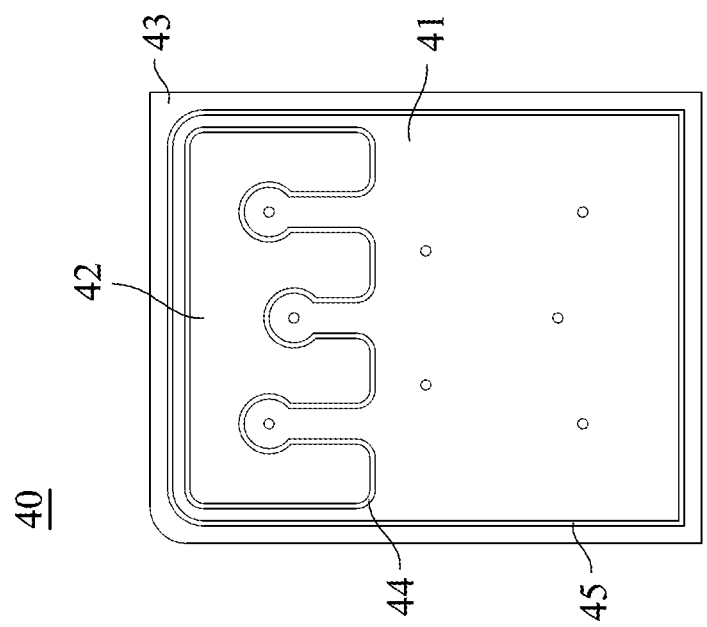
FIG. 6 is a top view of a first insulating structure of the light-emitting element disclosed in FIG. 1.
Figure 5:
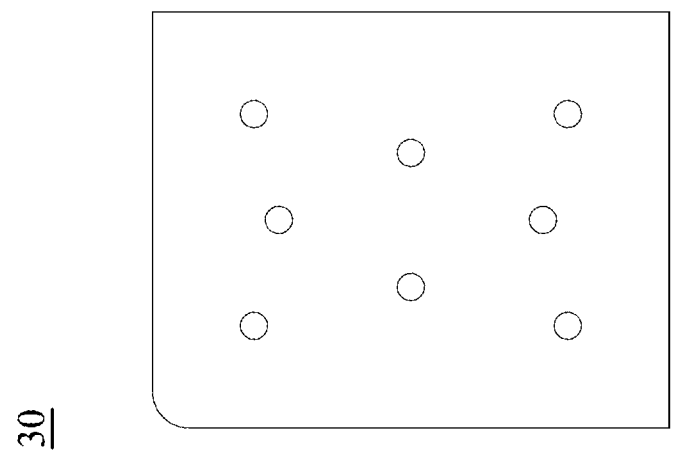
FIG. 5 is a top view of a reflective structure of the light-emitting element disclosed in FIG. 1.
Figure 4:
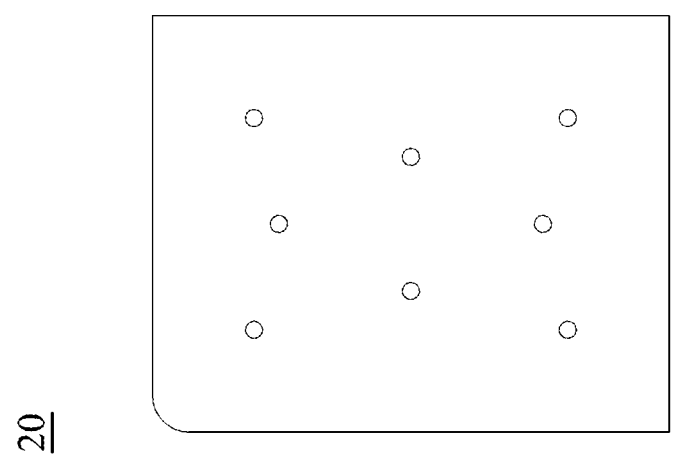
FIG. 4 is a top view of a semiconductor structure of the light-emitting element disclosed in FIG. 1.
Figure 9:
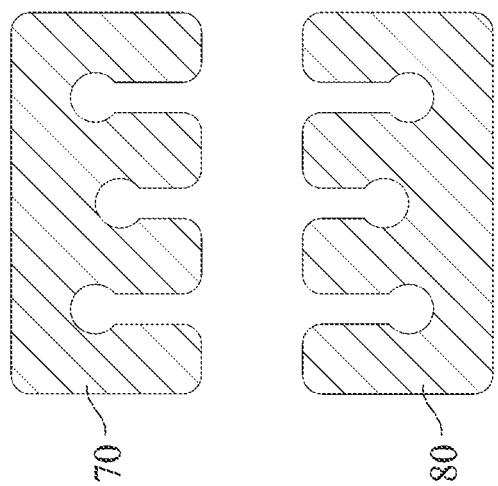
FIG. 9 is a top view of a first pad and a second pad of the light-emitting element disclosed in FIG. 1.
Figure 8:
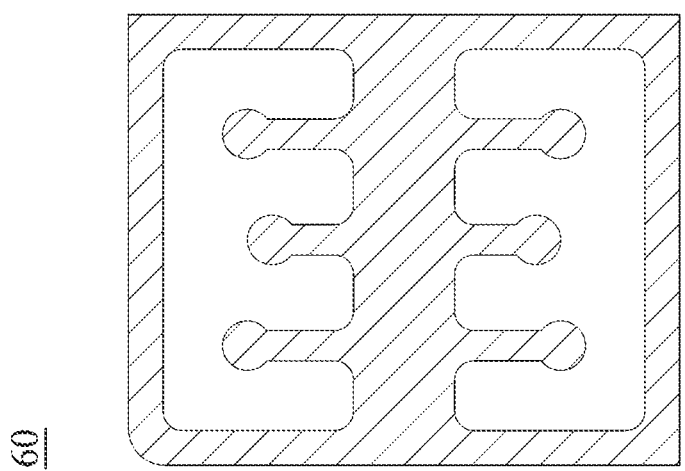
FIG. 8 is a top view of a second insulating structure of the light-emitting element disclosed in FIG. 1.
Figure 7:
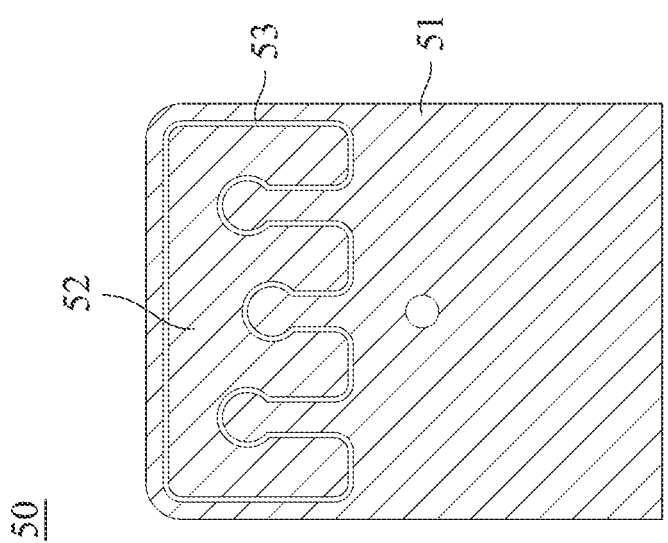
FIG. 7 is a top view of a conductive structure of the light-emitting element disclosed in FIG. 1.
Figure 12:
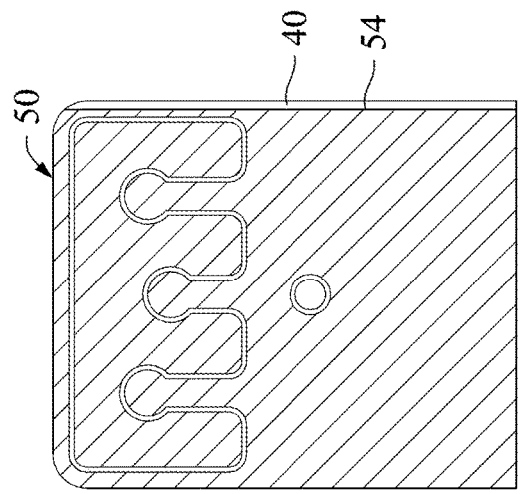
FIGS. 10 to 14 are top views of the conductive structure of the light-emitting element according to a plurality of embodiments of the present disclosure.
Figure 11:
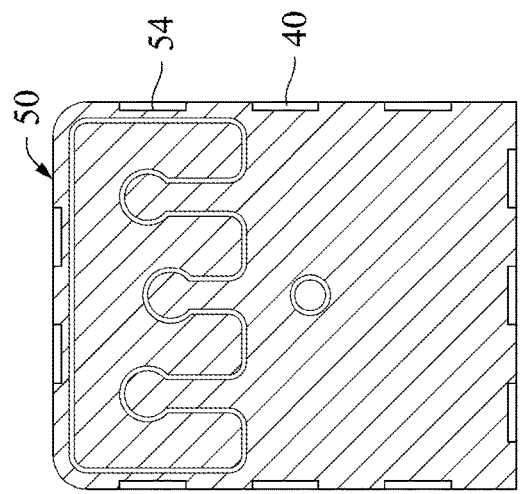
Figure 14:
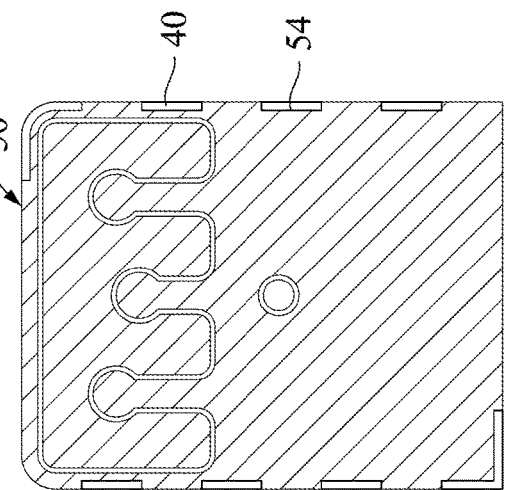
Figure 10:
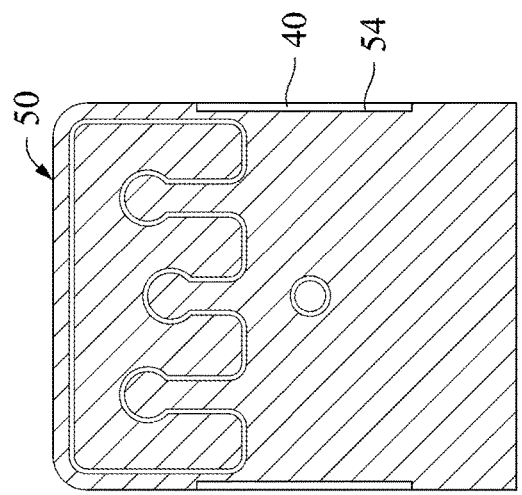
Figure 13:
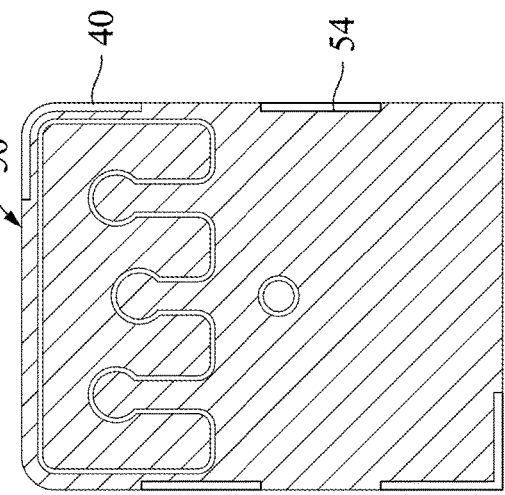

Some embodiments of the present disclosure, please refer to FIG. 1 which is a perspective view of a light-emitting element according to one embodiment of the present disclosure, FIG. 2 is a cross-sectional view of the light-emitting element along line AA' in FIG. 1, and FIG. 3 is a cross-sectional view of the light-emitting element along line BB' in FIG. 1. FIGS. 4 to 9 are a flow chart of the light-emitting element disclosed in FIG. 1. The light-emitting element of the present disclosure includes a substrate 10, a semiconductor structure 20, a reflective structure 30, a first insulating structure 40, a conductive structure 50, a second insulating structure 60, a first pad 70, a second pad 80, and a via 90.

The substrate 10 can be, but is not limited to, a sapphire substrate. In an embodiment, the substrate 10 is a growth substrate used to epitaxially grow semiconductor structure 20, including gallium arsenide (GaAs) wafer for growing aluminum gallium indium phosphide (AlGaInP), sapphire ($Al_2O_3$) wafer, gallium nitride (GaN) wafer or silicon carbide (SiC) wafer for growing indium gallium nitride (InGaN).

The semiconductor structure 20 is disposed on the substrate 10. The semiconductor structure 20 from bottom to top includes a first semiconductor layer 21, an active layer 22, and a second semiconductor layer 23. In one embodiment, the first semiconductor layer 21 is in a convex shape with a central protrusion, and a peripheral upper surface of the first semiconductor layer 21 from the outside to the inside is named a second peripheral upper surface 202, a first peripheral upper surface 201, and a third peripheral upper surface 203. The third peripheral upper surface 203 is adjacent to the central protrusion. In one embodiment, the active layer 22 is disposed on the central protrusion of the first semiconductor layer 21. In one embodiment, the first semiconductor layer 21 and the second semiconductor layer 23 can be cladding layers, and they have different conductivity types, electrical properties, polarities, or provide electrons or holes depending on the doped elements. For example, the first semiconductor layer 21 is an n-type electrical semiconductor layer, and the second semiconductor layer 23 is a p-type electrical semiconductor layer. The active layer 22 is formed between the first semiconductor layer 21 and the second semiconductor layer 23. Electrons and holes are recombined in the active layer 22 under a current drive, and the electrical energy is converted into light energy to emit a light.

The reflective structure 30 is disposed on a portion of the semiconductor structure 20. In one embodiment, the reflective structure 30 has a convex shape with a convex center. In detail, the reflective structure 30 is located in an outer periphery of the upper surface of the second semiconductor layer 23. The first insulating structure 40 covers the outer periphery of the upper surface of the semiconductor structure 20, a side wall of the second semiconductor layer 23, a side wall of the active layer 22, and the third peripheral upper surface 203. The material of the reflective structure 30 includes metal materials with high reflectivity for the light emitted by the active layer 22, such as silver (Ag), gold (Au), aluminum (Al), titanium (Ti), chromium (Cr), and copper (Cu), nickel (Ni), platinum (Pt) or alloys of the above materials. In one embodiment, the reflective structure 30 may further include a Bragg reflector (DBR) formed below the reflective structure 30. The Bragg reflector includes a plurality of pairs of sub-layers, and each of the sub-layers has a refractive index different from that of the adjacent sub-layers.

The first insulating structure 40 includes a first insulating portion 41, a second insulating portion 42, a third insulating portion 43, a gap 44, and a recession 45. The first insulating portion 41 covers the first portion 31 of the reflective structure 30. The second insulating portion 42 covers the second portion 32 of the reflective structure 30. The third insulating portion 43 covers the second peripheral upper surface 202 of the semiconductor structure 20, wherein the second peripheral upper surface 202 is located at the outside of the first peripheral upper surface 201. The gap 44 exposes the third portion 33 between the first portion 31 and the second portion 32 of the reflective structure 30, and separates the first insulating portion 41 and the second insulating portion 42. The recession 45 exposes the first peripheral upper surface 201 of the semiconductor structure 20. In one embodiment, the material of the first insulating structure 40 includes non-conductive materials. Non-conductive materials include organic materials, inorganic materials or dielectric materials. Organic materials include Sub, benzocyclobutene (BCB), perfluorocyclobutane (PFCB), epoxy, acrylic resin, cycloolefin polymer (COC), polymethylmethacrylate polyester (PMMA), polyethylene terephthalate (PET), polyimide (PI), polycarbonate (PC), polyetherimide, or fluorocarbon polymer. Inorganic materials include Silicone or Glass. The dielectric materials include aluminum oxide ($Al_2O_3$), silicon nitride ($SiN_x$), silicon oxide ($SiO_x$), titanium oxide ($TiO_x$), or magnesium fluoride ($MgF_x$). In one embodiment, the first insulating structure 40 can further include a Bragg reflector (DBR) formed on the upper surface of the reflective structure 30 and the side wall of the semiconductor structure 20, so that it can remedy the area that the reflective structure 30 cannot cover, so as to enhance the overall reflection ability and improve the brightness of the light-emitting element. The Bragg reflector includes a plurality of pairs of sub-layers, and each of the sub-layers has a refractive index different from that of the adjacent sub-layers.

The conductive structure 50 includes a first conductive portion 51, a second conductive portion 52, and a trench 53. The first conductive portion 51 is disposed on the first insulating portion 41 and contacts the first peripheral upper surface 201 of the semiconductor structure 20 through the recession 45. The second conductive portion 52 is disposed on the second insulating portion 42, and contacts the third portion 33 of the reflective structure 30 through the gap 44. The trench 53 separates the first conductive portion 51 and second conductive portion 52. In one embodiment, the material of the conductive structure 50 is indium tin oxide (ITO), nickel, silver, titanium, zinc, copper, gold, platinum, tungsten, aluminum, chromium, or the above metal alloys. The conductive structure 50 contacts the first peripheral upper surface 201 of the semiconductor structure 20 through the recession 45, so that the current of the N electrode can be uniformly diffused and the light emission is uniform.

In one embodiment, as shown in FIGS. 10 to 14, the conductive structure 50 further includes a plurality of concaves 54. These concaves 54 are located on the periphery of the conductive structure 50 and shrink toward the center of the conductive structure 50 in a horizontal direction. Specifically, FIGS. 10 and 11 belong to a symmetrical arrangement, and FIGS. 12, 13 and 14 belong to an asymmetrical arrangement.

The second insulating structure 60 covers the conductive structure 50 and the third insulating portion 43, and contacts the first insulating portions 41 of the first insulating structure 40 through the trench 53. The second insulating structure 60 includes a shape to correspondingly expose the first pad 70 and the second pad 80. In one embodiment, the second insulating structure 60 is not connected to the first pad 70 and the second pad 80. In one embodiment, the material of the second insulating structure 60 includes non-conductive materials. Non-conductive materials include organic materials, inorganic materials or dielectric materials. Organic materials include Sub, benzocyclobutene (BCB), perfluorocyclobutane (PFCB), epoxy, acrylic resin, cycloolefin polymer (COC), polymethylmethacrylate polyester (PMMA), polyethylene terephthalate (PET), polyimide (PI), polycarbonate (PC), polyetherimide, or fluorocarbon polymer. Inorganic materials include Silicone or Glass. The dielectric materials include aluminum oxide ($Al_2O_3$), silicon nitride ($SiN_x$), silicon oxide ($SiO_x$), titanium oxide ($TiO_x$), or magnesium fluoride ($MgF_x$).

The first pad 70 is disposed on the first conductive portion 51, and the second pad 80 is disposed on the second conductive portion 52. Each of the structures directly below the first pad 70 and the second pad 80 are in flat-type bonding, and there is no protrusion or recession design. In one embodiment, the first pad 70 and the second pad 80 comprise metal materials, such as chromium (Cr), titanium (Ti), tungsten (W), aluminum (Al), indium (In), tin (Sn), nickel (Ni), platinum (Pt), gold (Au), silver (Ag), copper (Cu) or alloys of the above materials. In one embodiment, the first pad 70 is N-PAD, and second pad 80 is P-PAD.

As shown in FIGS. 1 and 3, the via 90 penetrates through the active layer 22, the second semiconductor layer 23, the first portion 31 of the reflective structure 30, and the first insulating portion 41 of the first insulating structure 40 to expose the first semiconductor layer 21, and the first conductive portion 51 contacts the first semiconductor layer 21 through the via 90. Each of the first pad 70 and the second pad 80 has three concave shapes recessed from the central of the light-emitting element toward the outside of the light-emitting element, and a bottom of each of the concave shapes has the via 90.

Figure 17:
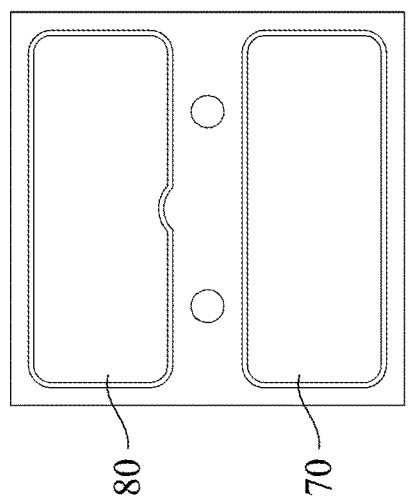
FIGS. 15 to 17 are top views of the light-emitting element according to a plurality of embodiments of the present disclosure.
Figure 16:
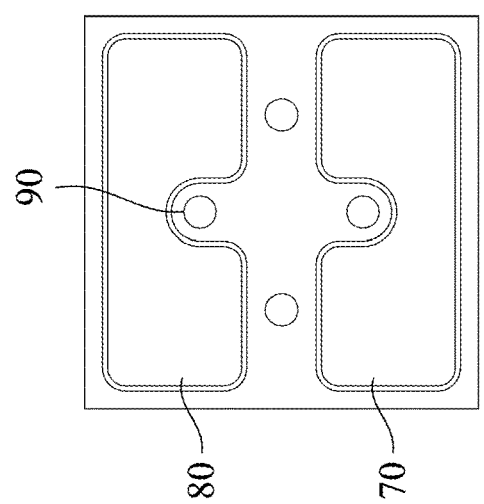
Figure 15:
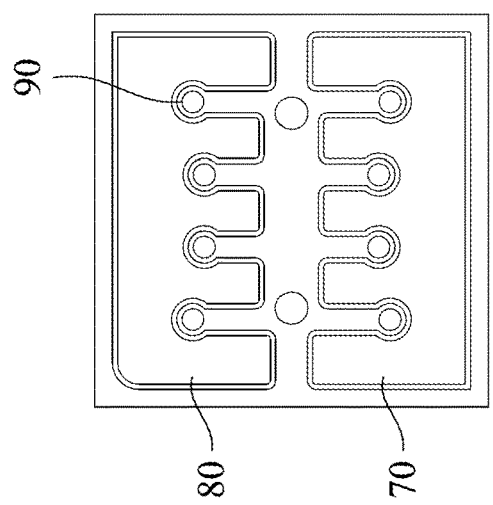

The present disclosure further provides various embodiments of different types of light-emitting elements, in which FIGS. 15 to 17 are top views of the light-emitting element according to a plurality of embodiments of the present disclosure. In detail, each of the first pad 70 and the second pad 80 in FIG. 15 has four concave shapes recessed from the central of the light-emitting element toward the outside of the light-emitting element, and a bottom of each of the concave shapes has the via 90. As shown in FIG. 16, each of the first pad 70 and the second pad 80 has one concave shape recessed from the central of the light-emitting element toward the outside of the light-emitting element, and a bottom of each of the concave shapes has the via 90. The second pad 80 in FIG. 17 has a slightly concave shape from the central of the light-emitting element toward the outside of the light-emitting element.

In many embodiments of the present disclosure, it can be understood from the cross-sectional views of FIGS. 2 to 3 that the present disclosure uses a eutectic phase and planarization design to improve stress resistance. For example, the structures directly under the first pad 70 and the second pad 80 are in flat-type bonding (for example, the reflective structure 30, the first insulating structure 40, and the conductive structure 50 are all consecutive planes), and there is no protrusion or recession design. At the same time, the first pad 70 and the second pad 80 bypass the via 90, so that the first pad 70 and the second pad 80 still have current distribution.

In addition, the present disclosure also uses the electrode ring design to increase the area of the N electrode contact, so that the current diffusion of the flip chip light emitting diode is uniform distribution. For example, the conductive structure 50 contacts the first peripheral upper surface 201 of the semiconductor structure 20 through the recession 45.

While the disclosure has been described by way of example(s) and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light-emitting element having two electrodes, comprising:
   a semiconductor structure;
   a reflective structure disposed on a portion of the semiconductor structure;
   a first insulating structure, comprising:

a first insulating portion covering a first portion of the reflective structure;

a second insulating portion covering a second portion of the reflective structure;

a gap exposing a third portion of the reflective structure directly between the first portion and the second portion of the reflective structure, and the third portion separating the first insulating portion and the second insulating portion; and a recession below a top surface of the reflective structure, and exposing a first peripheral upper surface of the semiconductor structure;

a conductive structure, comprising:

a first conductive portion disposed on the first insulating portion, and contacting the first peripheral upper surface of the semiconductor structure through the recession;

a second conductive portion disposed on the second insulating portion, and contacting the third portion of the reflective structure through the gap; and a trench separating the first conductive portion and the second conductive portion;

a first pad disposed on the first conductive portion, wherein a first electrode is form with the first pad and the first conductive portion; and a second pad disposed on the second conductive portion, wherein a second electrode is form with the second pad and the second conductive portion;

wherein portions of the reflective structure, the first insulating structure, the first conductive portion, and second conductive portion directly below the first pad and the second pad are in flat-type bonding with one another, and does not have any protrusion or recession design.

2. The light-emitting element of claim 1, wherein the conductive structure further comprises a plurality of concaves that are located at a peripheral of the conductive structure.

3. The light-emitting element of claim 1, wherein the first insulating structure further comprises a third insulating portion covering a second peripheral upper surface of the semiconductor structure, wherein the second peripheral upper surface is located at an outer side of the first peripheral upper surface.

4. The light-emitting element of claim 3, further comprising a second insulating structure, the second insulating structure covering the conductive structure and the third insulating portion, and contacting the first insulating portion of the first insulating structure through the trench, wherein the second insulating structure comprises a shape to correspondingly expose the first pad and the second pad.

5. The light-emitting element of claim 4, wherein the second insulating structure is not directly connected to the first pad and the second pad.

6. The light-emitting element of claim 1, wherein the semiconductor structure from bottom to top sequentially comprises a first semiconductor layer, an active layer, and a second semiconductor layer.

7. The light-emitting element of claim 6, further comprising at least one via penetrating through the active layer, the second semiconductor layer, the first portion of the reflective structure, and the first insulating portion of the first insulating structure exposing the first semiconductor layer, wherein the first conductive portion contacts the first semiconductor layer through the at least one via.

8. The light-emitting element of claim 1, further comprising a substrate, the semiconductor structure disposed on the substrate.

9. The light-emitting element of claim 1, wherein the first insulating structure further comprising a Bragg reflector formed on an upper surface of the reflective structure and a side wall of the semiconductor structure, wherein the Bragg reflector comprises a plurality of pairs of sub-layers, and each of the sub-layers has a refractive index different from that of the adjacent sub-layers.

* * * * *